United States Patent
Lu et al.

(10) Patent No.: US 11,462,440 B2
(45) Date of Patent: Oct. 4, 2022

(54) PACKAGING STRUCTURE

(71) Applicants: Semiconductor Manufacturing International (Shanghai) Corporation, Shanghai (CN); Semiconductor Manufacturing International (Beijing) Corporation, Beijing (CN)

(72) Inventors: Jian Gang Lu, Shanghai (CN); Fu Cheng Chen, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/859,021

(22) Filed: Apr. 27, 2020

(65) Prior Publication Data
US 2020/0258781 A1    Aug. 13, 2020

Related U.S. Application Data

(63) Continuation of application No. 16/042,846, filed on Jul. 23, 2018, now Pat. No. 10,672,662.

(30) Foreign Application Priority Data

Jul. 25, 2017  (CN) .......................... 201710611376.X

(51) Int. Cl.
*H01L 23/498*    (2006.01)
*H01L 25/065*    (2006.01)
*H01L 21/78*     (2006.01)
*H01L 23/00*     (2006.01)
*H01L 23/538*    (2006.01)

(52) U.S. Cl.
CPC .... *H01L 21/7806* (2013.01); *H01L 23/49816* (2013.01); *H01L 23/538* (2013.01); *H01L 24/19* (2013.01); *H01L 24/94* (2013.01); *H01L 24/96* (2013.01); *H01L 25/0655* (2013.01); *H01L 2224/04105* (2013.01); *H01L 2224/12105* (2013.01); *H01L 2224/18* (2013.01); *H01L 2924/18162* (2013.01); *H01L 2924/3511* (2013.01)

(58) Field of Classification Search
CPC ........... H01L 21/7806; H01L 23/49816; H01L 23/538; H01L 24/19; H01L 24/94; H01L 25/0655
See application file for complete search history.

(56) References Cited

U.S. PATENT DOCUMENTS

| | | | | |
|---|---|---|---|---|
| 6,586,276 B2 * | 7/2003 | Towle | ..................... | H01L 24/97 257/E23.019 |
| 6,586,822 B1 * | 7/2003 | Vu | .......................... | H01L 24/96 438/109 |
| 6,706,553 B2 * | 3/2004 | Towle | .................. | H01L 21/568 438/106 |
| 6,734,534 B1 * | 5/2004 | Vu | .......................... | H01L 24/19 257/680 |

(Continued)

*Primary Examiner* — Earl N Taylor
(74) *Attorney, Agent, or Firm* — Anova Law Group, PLLC

(57) ABSTRACT

A packaging structure is provided. The packaging structure includes a plurality of first chips; and a molding layer between adjacent first chips. The molding layer covers a sidewall of the first chip and exposes a top surface of the first chip.

8 Claims, 5 Drawing Sheets

(56) References Cited

U.S. PATENT DOCUMENTS

| | | | | |
|---|---|---|---|---|
| 6,894,399 B2* | 5/2005 | Vu | | H01L 23/16 257/786 |
| 7,071,024 B2* | 7/2006 | Towle | | H01L 24/19 257/737 |
| 7,078,788 B2* | 7/2006 | Vu | | H01L 21/56 257/691 |
| 7,618,846 B1* | 11/2009 | Pagaila | | H01L 24/19 257/E21.599 |
| 7,619,901 B2* | 11/2009 | Eichelberger | | H05K 3/30 361/764 |
| 7,704,796 B2* | 4/2010 | Pagaila | | H01L 23/3128 257/E21.597 |
| 8,101,460 B2* | 1/2012 | Pagaila | | H01L 24/19 438/731 |
| 8,188,584 B1* | 5/2012 | Berry | | H01L 24/94 438/460 |
| 8,236,617 B2* | 8/2012 | Pagaila | | H05K 1/186 257/E23.101 |
| 8,237,259 B2* | 8/2012 | Pressel | | H01L 24/24 438/689 |
| 8,258,012 B2* | 9/2012 | Pagaila | | H01L 23/3121 257/E23.114 |
| 8,273,604 B2* | 9/2012 | Kim | | H01L 21/568 438/460 |
| 8,367,470 B2* | 2/2013 | Pagaila | | H01L 23/49827 438/108 |
| 8,368,187 B2* | 2/2013 | Pagaila | | H01L 21/56 257/660 |
| 8,384,203 B2* | 2/2013 | Toh | | H01L 23/49833 438/126 |
| 9,153,494 B2* | 10/2015 | Choi | | H01L 21/561 |
| 9,177,926 B2* | 11/2015 | Scanlan | | H01L 23/3157 |
| 9,576,919 B2* | 2/2017 | Scanlan | | H01L 24/13 |
| 9,659,883 B2* | 5/2017 | Morita | | H01L 23/147 |
| 9,935,071 B1* | 4/2018 | Lin | | H01L 24/96 |
| 9,941,245 B2* | 4/2018 | Skeete | | H01L 25/0652 |
| 10,192,841 B2* | 1/2019 | Lin | | H01L 24/11 |
| 2001/0042902 A1 | 11/2001 | Wakabayashi et al. | | |
| 2002/0070443 A1* | 6/2002 | Mu | | H01L 24/19 257/796 |
| 2002/0074641 A1* | 6/2002 | Towle | | H01L 23/142 257/692 |
| 2002/0137263 A1* | 9/2002 | Towle | | H01L 21/56 438/106 |
| 2003/0092261 A1* | 5/2003 | Kondo | | H01L 21/67184 257/E21.174 |
| 2006/0275949 A1* | 12/2006 | Farnworth | | H01L 21/78 257/E21.597 |
| 2007/0181992 A1* | 8/2007 | Lake | | H01L 24/29 257/778 |
| 2007/0197018 A1* | 8/2007 | Chen | | H01L 23/147 257/E29.022 |
| 2008/0315372 A1* | 12/2008 | Kuan | | H01L 24/97 257/737 |
| 2008/0316714 A1* | 12/2008 | Eichelberger | | H05K 1/0218 361/728 |
| 2009/0139870 A1* | 6/2009 | Nagai | | H01L 21/2885 204/273 |
| 2010/0078789 A1* | 4/2010 | Choi | | H01L 23/49827 257/E21.511 |
| 2010/0167471 A1* | 7/2010 | Jin | | H01L 23/3128 257/E21.502 |
| 2011/0278703 A1* | 11/2011 | Pagaila | | H01L 23/49827 257/659 |
| 2012/0032340 A1* | 2/2012 | Choi | | H01L 21/561 257/777 |
| 2013/0062760 A1* | 3/2013 | Hung | | H01L 23/5389 257/738 |
| 2013/0217186 A1* | 8/2013 | Tani | | H01L 21/568 438/113 |
| 2015/0162289 A1* | 6/2015 | Chang | | H01L 24/96 257/750 |
| 2015/0243575 A1* | 8/2015 | Strothmann | | H01L 24/96 257/734 |
| 2015/0364344 A1* | 12/2015 | Yu | | H01L 23/367 257/713 |
| 2016/0035663 A1* | 2/2016 | Huang | | H01L 21/481 257/668 |
| 2016/0093580 A1* | 3/2016 | Scanlan | | H01L 24/02 438/114 |
| 2016/0211228 A1* | 7/2016 | Morita | | H01L 25/50 |
| 2017/0033009 A1* | 2/2017 | Scanlan | | H01L 21/561 |
| 2017/0243800 A1* | 8/2017 | Chang | | H01L 24/19 |
| 2017/0250158 A1* | 8/2017 | Chinnusamy | | H01L 21/6835 |
| 2018/0012863 A1* | 1/2018 | Yu | | H01L 21/76877 |
| 2018/0151342 A1* | 5/2018 | Fan | | H01L 21/02013 |
| 2018/0151477 A1* | 5/2018 | Yu | | H01L 23/485 |
| 2019/0035686 A1* | 1/2019 | Lu | | H01L 24/94 |

* cited by examiner

PACKAGING STRUCTURE

CROSS-REFERENCES TO RELATED APPLICATIONS

This application is a continuation application of U.S. patent application Ser. No. 16/042,846, filed on Jul. 23, 2018, which claims the priority of Chinese patent application No. 201710611376.X, filed on Jul. 25, 2017, the entirety of which is incorporated herein by reference.

FIELD OF THE DISCLOSURE

The present disclosure generally relates to the field of semiconductor manufacturing and, more particularly, relates to a packaging structure and fabrication method thereof.

BACKGROUND

Wafer level packaging (WLP) is a type of chip packaging method. After the production of the entire wafer is completed, packaging and testing are directly performed on the wafer. After completing the packaging and testing, the wafer is cut into single chips without wiring or gluing. The wafer level packaging provides small packaging size and maintains desired electrical properties of the wafer after being packaged. The wafer level packaging is easily compatible with wafer fabrication and chip assembly, thus, the process from wafer fabrication to product shipment is simplified, and production cost is reduced.

With the development of packaging technology, a thickness of the packaging structure becomes thinner. A fan-out wafer level packaging (FOWLP) is then developed. In the fan-out wafer level packaging, there is no need to use printed circuit boards (PCBs), but flexible expansion of I/O pads and small packaging area are provided. Therefore, the fan-out wafer level packaging significantly reduces the production cost.

However, the performance of the wafer packaged by the fan-out wafer level packaging is poor and still needs to be improved. The disclosed device structures and methods are directed to solve one or more problems set forth above and other problems in the art.

BRIEF SUMMARY OF THE DISCLOSURE

One aspect of the present disclosure includes a method for fabricating a packaging structure. The method includes providing a wafer. The wafer has a first surface and a second surface opposing to the first surface, and the wafer includes a plurality of first chip regions and a spacing region between adjacent first chip regions. The method also includes forming a first adhesive layer adhered to the second surface of the wafer, and forming an opening penetrating through the spacing region of the wafer and a plurality of first chips in the first chip regions on sides of the opening. Further, the method includes forming a molding layer in the opening. The molding layer covers a sidewall of the first chip and exposes a top surface of the first chip.

Another aspect of the present disclosure includes a packaging structure. The packaging structure includes a plurality of first chips, and a molding layer between adjacent first chips. The molding layer covers a sidewall of the first chip and exposes a top surface of the first chip.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
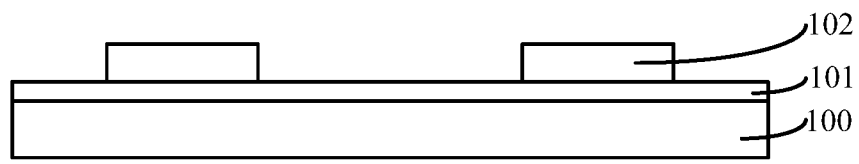
FIGS. 1-2 illustrate schematic diagrams of semiconductor structures corresponding to certain stages of a fabrication method for forming a packaging structure.
Figure 2:
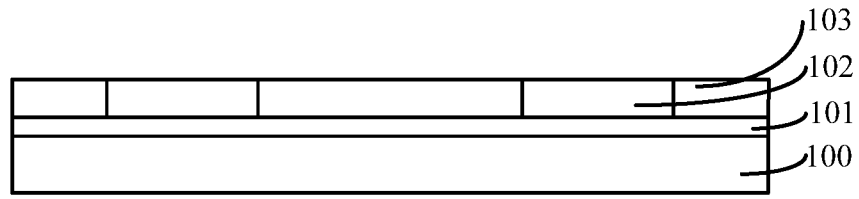

FIGS. 1-2 illustrate schematic diagrams of semiconductor structures corresponding to certain stages of a fabrication method for forming a packaging structure. Referring to FIG. 1, a first carrier board 100 is provided. A first adhesive layer 101 is formed on the first carrier board 100, and a plurality of chips 102 are loaded on the first adhesive layer 101. Referring to FIG. 2, a molding layer 103 is formed by performing a molding process on the plurality of chips 102.

Forming the chips 102 includes: providing a wafer; and dividing the wafer to form the chips 102. After forming the chips 102, the plurality of chips 102 are selected and loaded on the first adhesive layer 101. To facilitate loading the chips 102, a spacing between adjacent chips 102 is configured to be substantially large. The molding layer 103 is subsequently formed between the adjacent chips 102, such that the molding layer 103 occupies a substantially large volume proportion in the formed packaging structure.

In addition, the molding layer 103 is made of an epoxy molding compound (EMC), and the chip 102 is made of silicon. The epoxy molding compound (EMC) has a larger coefficient of thermal expansion (CTE) than the chip 102. The process of forming the packaging structure includes multiple high-temperature processes, and the high-temperature process easily causes the stress difference between the molding layer 103 and the chip 102 to be substantially large. As such, the packaging structure is easily warped, thereby affecting the quality of the packaged product.

The present disclosure provides a packaging structure and fabrication method thereof. The fabrication method for forming a packaging structure includes providing a wafer, where the wafer includes a plurality of first chip regions and a spacing region between adjacent first chip regions; forming an opening penetrating through the spacing region of the wafer and a plurality of first chips in the first chip regions on sides of the opening; and forming a molding layer in the opening. Accordingly, a volume proportion of the molding layer in the packaging structure may be reduced, and the packaging structure may not be warped.

Figure 21:
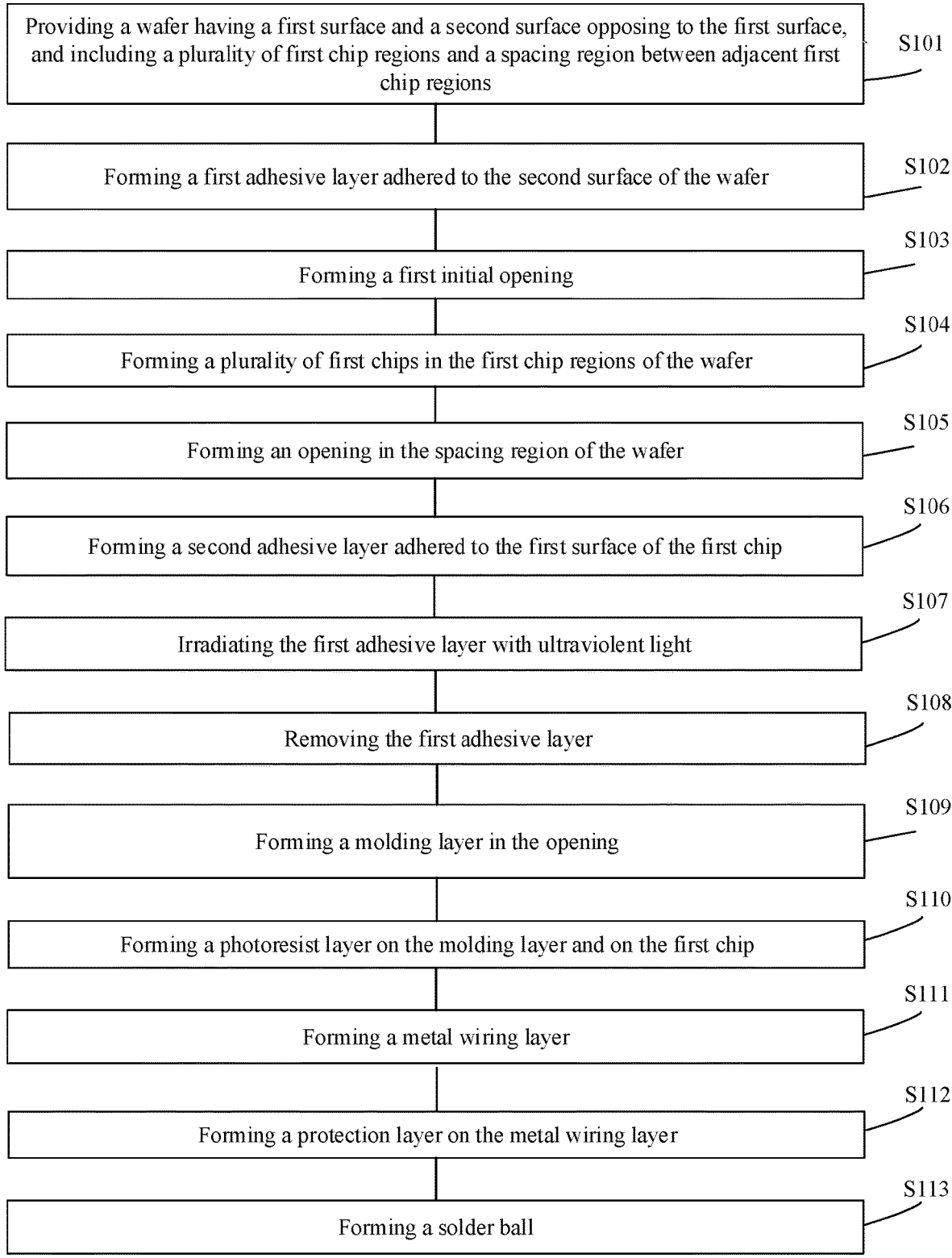
FIG. 21 illustrates an exemplary fabrication method for forming a packaging structure consistent with various disclosed embodiments of the present disclosure.

FIG. 21 illustrates an exemplary fabrication method for forming a packaging structure consistent with various disclosed embodiments of the present disclosure; and FIGS. 3-16 illustrate schematic diagrams of semiconductor structures corresponding to certain stages of the exemplary fabrication method.

Figure 3:
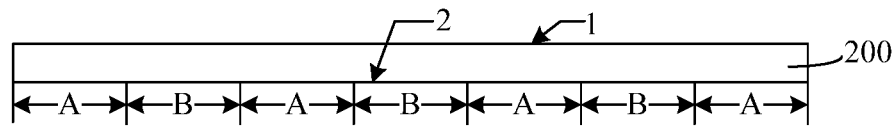
FIGS. 3-16 illustrate schematic diagrams of semiconductor structures corresponding to certain stages of an exemplary fabrication method for forming a packaging structure consistent with various disclosed embodiments of the present disclosure.

As shown in FIG. 21, at the beginning of the fabrication method, a wafer with certain structures may be provided (S101). FIG. 3 illustrates a schematic diagram of a corresponding semiconductor structure.

Referring to FIG. 3, a wafer 200 may be provided. The wafer 200 may have a first surface 1 and a second surface 2 opposing to the first surface 1. The wafer 200 may include a plurality of first chip regions A and a spacing region B between adjacent chip regions A. The wafer 200 may be made of silicon. The wafer 200 may provide desired hardness and flatness, facilitating to reduce a failure ratio of packaging devices.

The first chip region A of the wafer 200 may be used to subsequently form a first chip, such that the wafer 200 may be effectively utilized. Moreover, the first chip may not have to be unloaded and loaded in subsequent processes, thus, the process complexity may be reduced. The spacing region B may be used to subsequently form an opening.

A cutting line (not illustrated) may be configured on the first surface 1 of the wafer 200. A plurality of first chips may be subsequently formed by cutting the wafer 200 from the first surface 1 to the second surface 2 of the wafer 200 along the cutting line. The first chip may be disposed on a subsequently formed first adhesive layer. The second surface 2 of the wafer 200 may be subsequently adhered to the first adhesive layer.

Figure 4:
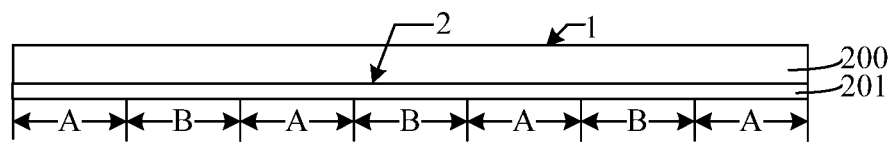

Returning to FIG. 21, after providing the wafer, a first adhesive layer may be formed (S102). FIG. 4 illustrates a schematic diagram of a corresponding semiconductor structure.

Referring to FIG. 4, a first adhesive layer 201 may be formed and adhered to the second surface 2 of the wafer 200. The first adhesive layer 201 may be used to subsequently fasten a first chip.

In one embodiment, the first adhesive layer 201 may be made of epoxy resin. In another embodiment, the first adhesive layer may be made of silica gel. In certain embodiments, the first adhesive layer 201 may be made of an organic adhesive, which may have features of fast adhesion, no influence on the adhesive structure, easy removal, low cost, and high adhesive strength, etc. Therefore, the second surface 2 of the wafer 200 may be adhered to the first adhesive layer 201 by using the organic adhesive.

In one embodiment, the first adhesive layer 201 may be made of a white adhesive. The white adhesive is an adhesive material that may be reacted under irradiation of ultraviolet light of a certain wavelength. The white adhesive may have high adhesion when not being irradiated with ultraviolet light, while may have significantly reduced or even vanished adhesion after being irradiated with ultraviolet light due to breakdown of crosslinked chemical bonds in the material. Therefore, adhesive force between the first adhesive layer 201 and the wafer 200 may be reduced by a subsequent ultraviolet light irradiation, facilitating the removal of the first adhesive layer 201.

In one embodiment, forming the first adhesive layer 201 may include a spin coating process. In another embodiment, forming the first adhesive layer may include a printing process.

A dividing process may be subsequently performed on the spacing regions B of the wafer 200 to provide a plurality of openings and the plurality of first chips in the first chip regions A on sides of the opening. Forming the first chips and the openings may include the following. A first initial opening may be formed from the second surface 2 into the wafer 200 by performing a contactless, half-cutting process on the spacing region B of the wafer 200, and the first initial opening thus exposes the first adhesive layer 201. The first initial opening may have a first predetermined depth, and the first predetermined depth may be smaller than a thickness of the wafer 200. After forming the first initial opening, a polishing process may be performed on the first surface 1 of the wafer 200 until the first initial opening is exposed. The first chips are therefore divided and provided. After forming the first chips, an opening may be formed by performing a film expansion process on the first initial opening.

Figure 5:
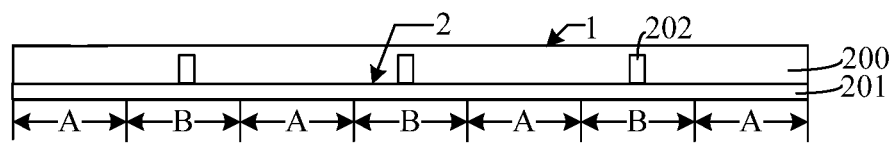

Returning to FIG. 21, after forming the first adhesive layer, a first initial opening may be formed (S103). FIG. 5 illustrates a schematic diagram of a corresponding semiconductor structure.

Referring to FIG. 5, a first initial opening 202 may be formed to expose the first adhesive layer 201 by performing a contactless, half-cutting process on the spacing region B of the wafer 200. The contactless, half-cutting process may include an infrared stealth dicing process. The infrared stealth dicing process may be a type of contactless process, and may not generate mechanical stress on the wafer 200. Thus, damages on the wafer 200 may be substantially small. Due to features of infrared light focusing, a focus point may be as small as on a sub-micron order to provide the microprocessing performed on the wafer 200 as desired. A substantially high energy density may be obtained even at a low level of pulse capability, such that a material processing may be effectively performed to minimize a carbonization effect subjected to the wafer 200 when being cut. At the same time, a cutting speed may be speed up, and a wafer cutting efficiency may be improved.

The first initial opening 202 may be formed by breaking down silicon-silicon bonds in the cutting line of the first chip region A of the wafer 200 through the half-cutting process, facilitating subsequently forming the opening. The first initial opening 202 may have the first predetermined depth, and the first predetermined depth may be determined according to actual process requirements. The first predetermined depth may be less than the thickness of the wafer 200, and a bottom of the first initial opening 202 may expose the first adhesive layer 201 at the second surface 2 of the wafer 200, facilitating subsequently forming the first chip with desired performance.

In one embodiment, the half-cutting process may be performed on the spacing region B of the wafer 200, such that the wafer 200 may be effectively utilized. The first chip region A of the wafer 200 may be used to subsequently form the first chips. Therefore, when packaging, there is no need to select chip(s) from another wafer and to align and mount the selected chip(s). The complexity and difficulty of the packaging process may be effectively reduced.

The half-cutting process may be performed on the spacing region B of the wafer 200 to form the first initial opening 202, such that a size of the first initial opening 202 in a direction parallel to a surface of the second surface 2 of the wafer 200 may be substantially small. The first initial opening 202 may be used to subsequently form an opening. Therefore, a size of the opening in the direction parallel to the surface of the second surface 2 of the wafer 200 may be substantially small.

Figure 6:
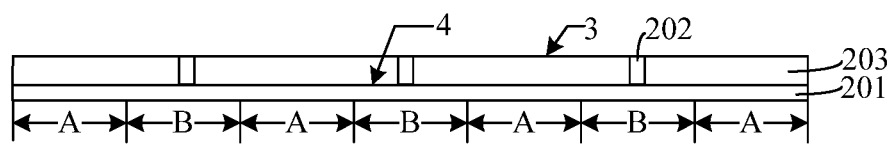

Returning to FIG. 21, after forming the first initial opening, a plurality of first chips may be formed (S104). FIG. 6 illustrates a schematic diagram of a corresponding semiconductor structure.

Referring to FIG. 6, after forming the first initial opening 202, a plurality of first chips 203 may be formed by performing a polishing process on the first surface 1 of the wafer 200 until the first initial opening 202 is exposed. In various embodiments, the first chip 203 may be a sensor chip, a logic circuit chip, or a memory chip, etc.

The polishing process may reduce the thickness of the wafer 200 until a top surface of the first initial opening 202 is exposed, facilitating forming the first chip 203. The first chip 203 may have a first surface 3 and a second surface 4 opposing to the first surface 3. The second surface 4 of the first chip 203 may be adhered to the first adhesive layer 201. The first surface 3 of the first chip 203 may be subsequently adhered to a second adhesive layer.

Figure 7:
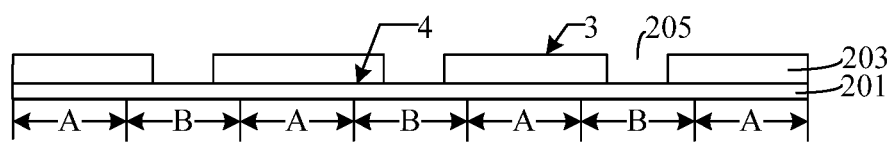

Returning to FIG. 21, after forming the plurality of first chips, an opening may be formed (S105). FIG. 7 illustrates a schematic diagram of a corresponding semiconductor structure.

Referring to FIG. 7, an opening 205 may be formed in the spacing region B of the wafer 200 by performing a film expansion process on the first initial opening 202 (illustrated in FIG. 6).

The film expansion process may include: providing a film expansion apparatus having a carrier stage; placing the wafer 200 on the carrier stage with the first surface 3 of the first chip 203 facing upward; and performing the film expansion process on the first initial opening. A parameter of the film expansion process may include a temperature in a range of approximately 45° C.-55° C.

Before placing the wafer 200 on the carrier stage, the carrier stage may be preheated to a temperature in a range of approximately 45° C.-55° C. for a preheating time in a range of approximately 5 minutes-10 minutes.

The opening 205 may be used to subsequently accommodate a molding layer. Because the opening 205 is formed by performing the dividing process on the spacing region B of the wafer 200, a size of the opening 205 in a direction parallel to a surface of the second surface 4 of the first chip may be substantially small. Moreover, the size of the opening 205 in the direction parallel to the surface of the second surface 4 of the first chip may be controlled according to process conditions of the film expansion process, such that the size of the opening 205 in the direction parallel to the surface of the second surface 4 of the first chip may be further reduced. Therefore, the molding layer subsequently formed in the opening 205 may occupy a substantially small volume proportion in the formed packaging structure, facilitating to prevent warpage of the packaging structure, and improving the quality of the packaged product.

A molding layer may be subsequently formed in the opening 205. Before forming the molding layer, the first surface 3 of the plurality of first chips 203 may be adhered to a second adhesive layer. After adhering the first surface 3 of the plurality of first chips 203 to the second adhesive layer, the first adhesive layer 201 may be irradiated with ultraviolet light. After the first adhesive layer is irradiated with ultraviolet light, the first adhesive layer 201 may be removed to expose the second surface 4 of the plurality of first chips 203.

Figure 8:
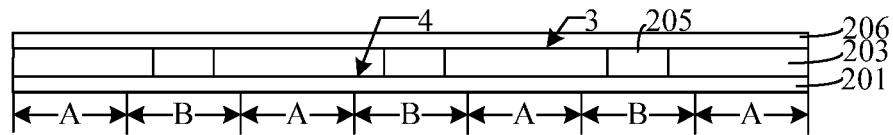

Returning to FIG. 21, after forming the opening, a second adhesive layer may be formed (S106). FIG. 8 illustrates a schematic diagram of a corresponding semiconductor structure.

Referring to FIG. 8, a second adhesive layer 206 may be formed and adhered to the first surface 3 of the first chip 203. The second adhesive layer 206 may be made of the white adhesive. Forming the second adhesive layer 206 may include a spin coating process, or a printing process, etc. The second adhesive layer 206 may be used to fasten the first chips 203.

Figure 9:
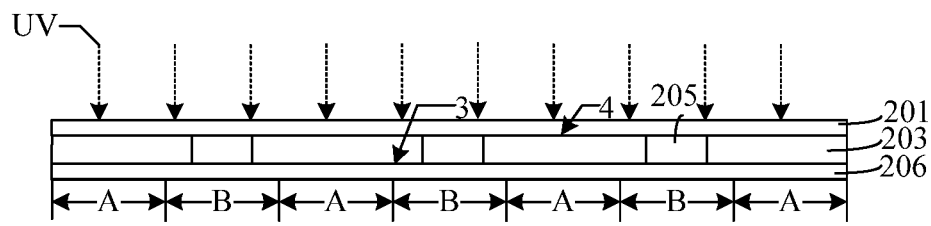

Returning to FIG. 21, after forming the second adhesive layer, the first adhesive layer may be irradiated with ultraviolet light (S107). FIG. 9 illustrates a schematic diagram of a corresponding semiconductor structure.

Referring to FIG. 9, after adhering the first surface 3 of the first chip 203 to the second adhesive layer 206, the first adhesive layer 201 may be irradiated with ultraviolet light.

After being irradiated with ultraviolet light, the cross-linked chemical bonds in the first adhesive layer 201 may be broken down, such that the adhesion of the first adhesive layer 201 may be significantly reduced or vanished, facilitating subsequently removing the first adhesive layer 201 to expose the second surface 4 of the first chip 203.

Figure 10:
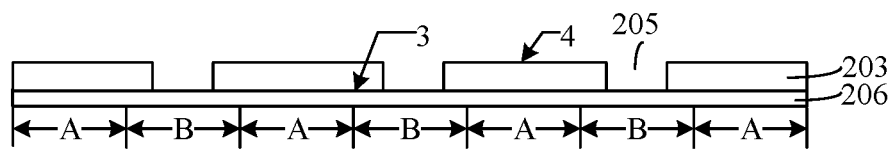

Returning to FIG. 21, after irradiating the first adhesive layer with ultraviolet light, the first adhesive layer may be removed (S108). FIG. 10 illustrates a schematic diagram of a corresponding semiconductor structure.

Referring to FIG. 10, after the first adhesive layer 201 is irradiated with ultraviolet light, the first adhesive layer 201 may be removed to expose the second surface 4 of the first chip 203. The removal of the first adhesive layer 201 may facilitate exposing the opening 205. The opening 205 may be used to subsequently form a molding layer.

Figure 11:
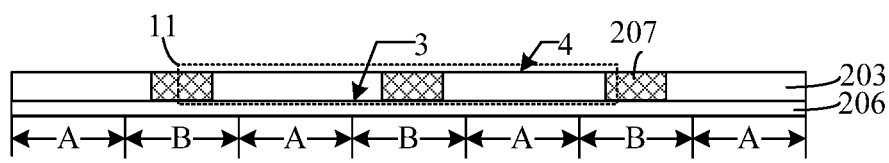
Figure 12:
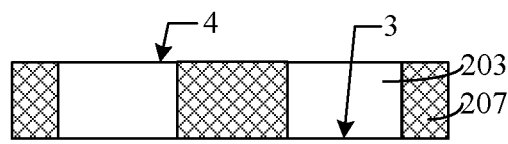

Returning to FIG. 21, after removing the first adhesive layer, a molding layer may be formed (S109). FIGS. 11-12 illustrate schematic diagrams of a corresponding semiconductor structure. FIG. 12 is a zoom-in image of a region 11 in FIG. 11.

Referring to FIGS. 11-12, a molding film (not illustrated) may be formed in the opening 205 and on the first chips 203, and a molding layer 207 may be formed by polishing the molding film until the second surface 4 of the first chip 203 is exposed. The molding layer 207 may cover sidewalls of the first chips 203.

In one embodiment, the molding film may be made of a molding material. In one embodiment, the molding material may include epoxy resin. Correspondingly, the molding layer 207 may be made of the epoxy resin. The epoxy resin may have desired sealing performance and simple molding, and, thus, may be a desired material for forming the molding layer 207.

In certain embodiments, the molding layer may be made of the molding material, and the molding material may include polyimide resin, benzocyclobutene resin, polybenzoxazole resin, polybutylene terephthalate, polycarbonate, polyethylene terephthalate, polyethylene, polypropylene, polyolefin, polyurethane, polyolefin, polyethersulfone, polyamide, polyurethane, ethylene-vinyl acetate copolymer, or polyvinyl alcohol, etc.

In one embodiment, forming the molding layer 207 may include an injection molding. In another embodiment, forming the molding layer 207 may include a transfer molding, or a screen printing process, etc.

The injection molding for forming the molding film may include: providing a mold; filling the mold with the molding material to cover the first chips 203; and heating and curing the molding material to form the molding film. The molding layer 207 may not only protect the first chips 203, but also serve as a carrier for subsequent processes.

In one embodiment, the molding layer 207 may be made of epoxy resin, and the first chip 203 may be made of silicon. Coefficients of thermal expansion of the molding layer 207 and the first chip 203 may be significantly different, such that the internal stress difference between the molding layer 207 and the first chip 203 may be substantially large. However, because the molding layer 207 occupies a small volume proportion in the packaging structure, the probability of occurrence of warpage in the formed package structure in subsequent processes may be reduced, and the quality of the packaged product may be improved.

Figure 13:
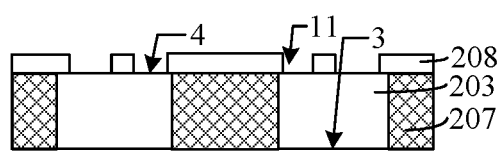

Returning to FIG. 21, after forming the molding layer, a photoresist layer may be formed (S110). FIG. 13 illustrates a schematic diagram of a corresponding semiconductor structure.

Referring to FIG. 13, a photoresist layer 208 may be formed on the molding layer 207 and the first chips 203. The photoresist layer 208 may include a first opening 11, and a bottom of the first opening 11 may expose the second surface 4 of the first chips 203. The photoresist layer 208 may be made of a positive photoresist, or a negative photoresist.

The bottom of the first opening 11 may expose the second surface 4 of the first chips 203, facilitating interconnection between a subsequently formed metal wiring layer and the first chip 203.

Figure 14:
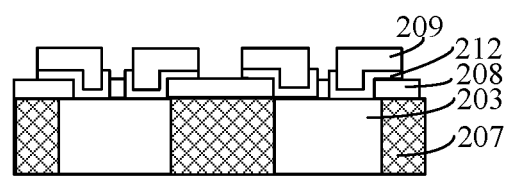

Returning to FIG. 21, after forming the photoresist layer, a metal wiring layer may be formed (S111). FIG. 14 illustrates a schematic diagram of a corresponding semiconductor structure.

Referring to FIG. 14, a metal wiring layer 209 may be formed on portions of the photoresist layer 208 and in the first opening 11. The metal wiring layer 209 may be made of Cu. Forming the metal wiring layer 209 may include an electroplating process, or a physical deposition process, etc. The metal wiring layer 209 may be used to realize the interconnection and routing of the first chip 203 and a subsequently formed solder ball.

Before forming the metal wiring layer 209, a seed layer 212 may be formed on portions of the photoresist layer 208 and in the first opening 11. The seed layer 212 may be made of a metal. Forming the seed layer 212 may include an electroplating process. The seed layer 212 may electrically connect the metal wiring layer 209 and the first chip 203.

Figure 15:
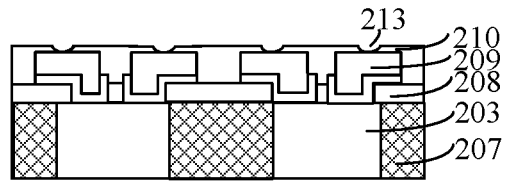

Returning to FIG. 21, after forming the metal wiring layer, a protection layer may be formed (S112). FIG. 15 illustrates a schematic diagram of a corresponding semiconductor structure.

Referring to FIG. 15, a protection layer 210 may be formed on the metal wiring layer 209. The protection layer 210 may be made of an insulating material, and the insulating material may include an organic insulating material, or an inorganic insulating material.

In one embodiment, when the protection layer 210 is made of the organic insulating material, the organic insulating material may include polyvinyl chloride or resin. The resin may include epoxy resin, polyimide resin, benzocyclobutene resin, or polybenzoxazole resin, etc. Correspondingly, forming the protection layer 210 may include a spraying coating process, or an injection molding process, etc.

In another embodiment, when the protection layer 210 is made of the inorganic insulating material, the inorganic insulating material may include one or more of silicon oxide, silicon nitride, and silicon oxynitride. Correspondingly, forming the protection layer 210 may include a chemical vapor deposition process, a physical vapor deposition process, or an atomic layer deposition process, etc.

A second opening 213 may be formed in the protection layer 210, and a bottom of the second opening 213 may expose the metal wiring layer 209, facilitating the interconnection between a solder ball subsequently formed in the second opening 213 and the metal wiring layer 209.

Figure 16:
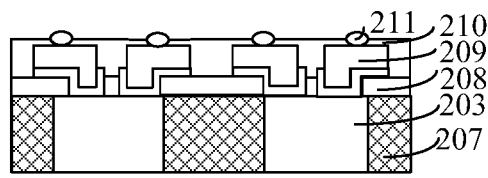

Returning to FIG. 21, after forming the protection layer, a solder ball may be formed (S113). FIG. 16 illustrates a schematic diagram of a corresponding semiconductor structure.

Referring to FIG. 16, a solder ball 211 may be formed in the second opening 213 in the protection layer 210. After forming the protection layer 210 and before forming the solder ball 211, an under ball metal structure (UBM) may be formed. The under ball metal structure may include a single metal layer or a plurality of stacked metal layers. The single metal layer or the plurality of stacked metal layers may be made of one or more of copper, aluminum, nickel, cobalt, titanium, and tantalum.

The solder ball 211 may be formed in the second opening in the protection layer 210. The solder ball 211 may be made of tin. In one embodiment, forming the solder ball 211 may include: printing a tin paste on a surface of the protection layer 210; and reflowing the tin paste at a high temperature to form the solder ball 211 under the effect of surface tension. In another embodiment, flux and solder ball particles may be first printed on the surface of the protection layer, and then may be reflowed at a high temperature to form the solder ball. In certain embodiments, tin pillars may be electroplated on the surface of the protection layer, and then may be reflowed at a high temperature to form the solder ball.

The metal wiring layer on the molding layer and on the first chip, the protection layer on the metal wiring layer, the under ball metal structure on the protection layer, and the metal solder ball on the under ball metal structure may form a metal interconnection structure.

Correspondingly, a packaging structure is also provided in the present disclosure. Referring to FIG. 11, the packaging structure may include a plurality of first chips 203, and a molding layer 207 between adjacent first chips 203. The molding layer 207 may cover a sidewall of the first chip 203, and may expose a top surface of the first chip 203. Forming the molding layer 207 may include forming an opening 205 (illustrated in FIG. 10) between adjacent first chips 203; and forming the molding layer 207 in the opening 205.

A coefficient of thermal expansion of the molding layer 207 may be greater than a coefficient of thermal expansion of the first chip 203. The molding layer 207 may be made of epoxy resin, imide resin, benzocyclobutene resin, polybenzoxazole resin, polybutylene terephthalate, polycarbonate, polyethylene terephthalate, polyethylene, polypropylene, polyolefin, polyurethane, polyolefin, polyethersulfone, polyamide, polyurethane, ethylene-vinyl acetate copolymer, or polyvinyl alcohol, etc. The first chip 203 may be made of silicon.

In addition to the first chips, more chips may be included in the spacing region B. For example, the spacing region B may also include a plurality of third chip regions (not illustrated), and a plurality of third chips may be formed in the third chip regions. A size of the third chip may be different from the size of the first chip. The size of every third chip may be the same, or different.

Figure 22:
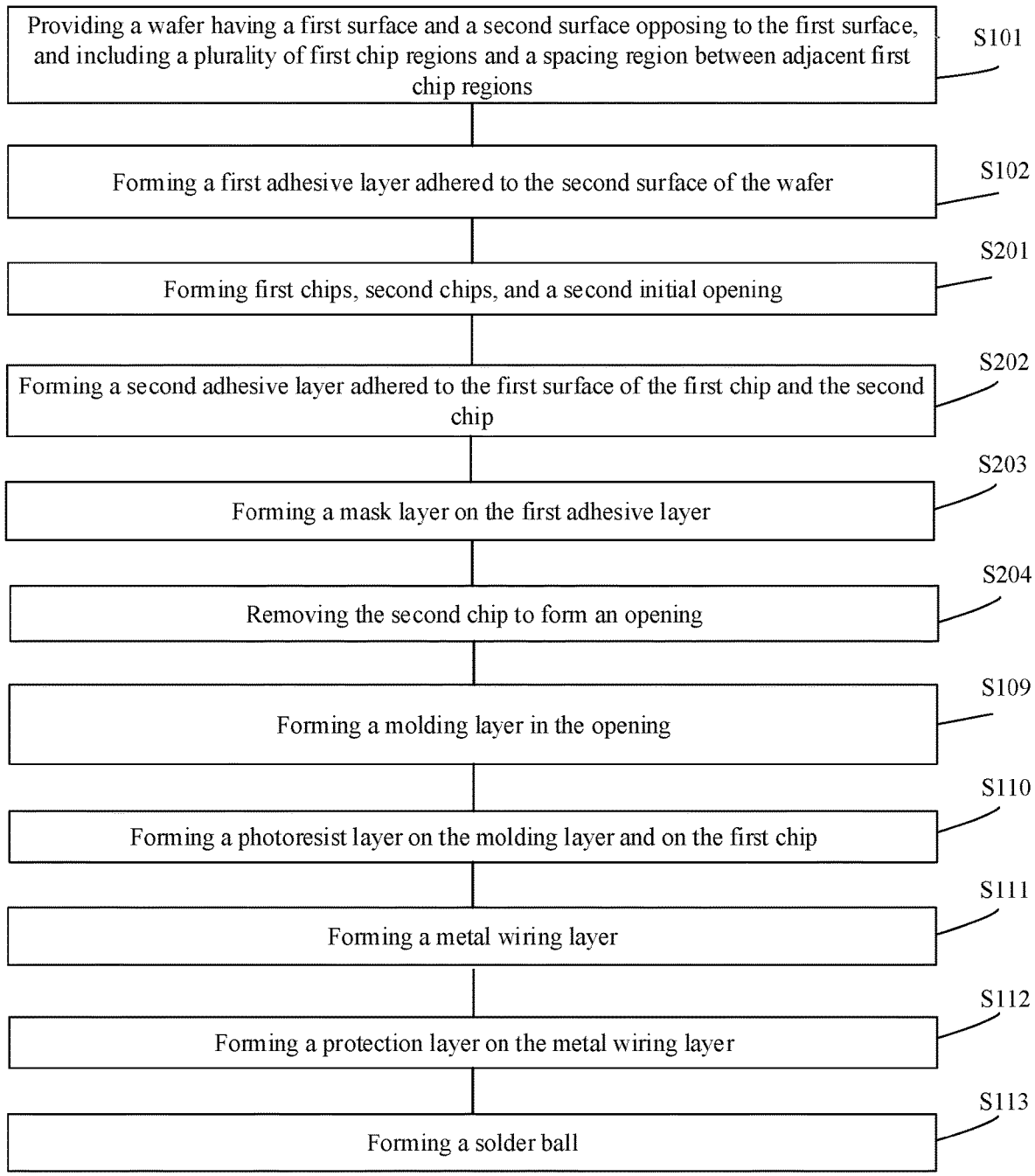
FIG. 22 illustrates another exemplary fabrication method for forming a packaging structure consistent with various disclosed embodiments of the present disclosure.

FIG. 22 illustrates another exemplary fabrication method for forming a packaging structure consistent with various disclosed embodiments of the present disclosure; and FIGS.

17-20 illustrate schematic diagrams of semiconductor structures corresponding to certain stages of the exemplary fabrication method.

The difference between the exemplary fabrication method illustrated in FIGS. 17-20 and the exemplary fabrication method illustrated in FIGS. 3-16 may include that, in one embodiment, the spacing region B may include a second chip region C. The same or similar features of the present exemplary fabrication method and the above-described exemplary fabrication method are not repeated herein.

Figure 17:
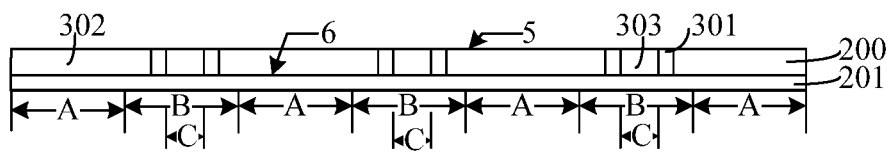
FIGS. 17-20 illustrate schematic diagrams of semiconductor structures corresponding to certain stages of another exemplary fabrication method for forming a packaging structure consistent with various disclosed embodiments of the present disclosure.

As shown in FIG. 22, after forming the first adhesive layer associated with FIG. 4, a first chip, a second chip, and a second initial opening may be formed (S201). FIG. 17 illustrates a schematic diagram of a corresponding semiconductor structure.

Referring to FIG. 17, the spacing region B may include a second chip region C. A first chip 302 may be formed in the first chip region A, a second chip 303 may be formed in the second chip region C, and a second initial opening 301 may be formed between adjacent first chip 302 and second chip 303.

Forming the second chip 303, the first chip 302, and the second initial opening 301 may include the following. The second initial opening 301 may be formed to expose the first adhesive layer 201 by performing a contactless, half-cutting process on the spacing region B between the first chip region A and the second chip region C. The second initial opening 301 may have a second predetermined depth, and the second predetermined depth may be smaller than a thickness of the wafer 200. After forming the second initial opening 301, by performing a polishing process on the first surface 1 of the wafer 200 until the second initial opening 301 is exposed, the first chip 302 may be formed in the first chip region A, and the second chip 303 may be formed in the second chip region C.

The similarities between FIG. 17 and FIG. 6 are not repeated herein, while certain differences may include that a plurality of second chips 303 may be formed while forming a plurality of first chips 302.

In addition to the first chips, more chips may be included in the spacing region B. For example, the spacing region B may also include a third chip region (not illustrated), and a third chip may be formed in the third chip region. Forming the third chip may include the following. A third initial opening may be formed to expose the first adhesive layer 201 by performing a contactless, half-cutting process on the spacing region B between the first chip region A and the third chip region as well as between the second chip region B and the third chip region. The third initial opening may have a third predetermined depth, and the third predetermined depth may be smaller than the thickness of the wafer 200. After forming the third initial opening, by performing a polishing process on the first surface 1 of the wafer 200 until the third initial opening is exposed, the plurality of third chips may be formed in the third chip regions of the wafer 200. The third chip may have a size different from the first chip 302 and the second chip 303. The size of every third chip may be the same, or different.

The first chip 302 and the second chip 303 may have a first surface 5 and a second surface 6 opposing to the first surface 5. The second surface 6 of the first chip 302 and the second chip 303 may be adhered to the first adhesive layer 201.

Figure 18:
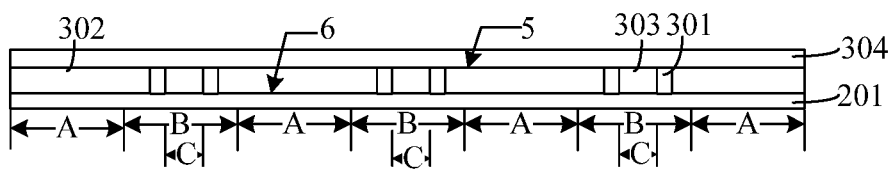

Returning to FIG. 22, after forming the first chip, the second chip, and the second initial opening, a second adhesive layer may be formed (S202). FIG. 18 illustrates a schematic diagram of a corresponding semiconductor structure.

Referring to FIG. 18, a second adhesive layer 304 may be formed and adhered to the first surface 5 of the first chip 302 and the second chip 303.

The second adhesive layer 304 may be made of a same material as the first adhesive layer 201, and a fabrication process of the second adhesive layer 304 may be the same as the fabrication process of the first adhesive layer 201. Therefore, the material and the fabrication process of the second adhesive layer 304 are not described herein.

Figure 19:
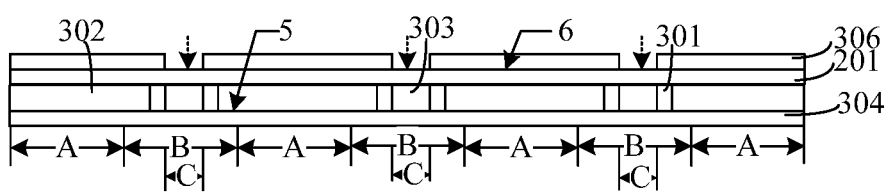

Returning to FIG. 22, after forming the second adhesive layer, a mask layer may be formed (S203). FIG. 19 illustrates a schematic diagram of a corresponding semiconductor structure.

Referring to FIG. 19, after adhering the first surface 5 of the first chip 302 and the second chip 303 to the second adhesive layer 304, a mask layer 306 may be formed on the first adhesive layer 201. The mask layer 306 may include a mask opening (not illustrated), and a bottom of the mask opening may expose the first adhesive layer 201 under the second chip 303. The first adhesive layer 201 may be irradiated with ultraviolet light using the mask layer 306 as a mask.

The mask layer 306 may be made of silicon nitride. The mask layer 306 may cover the first chip 302, such that ultraviolet light may not be irradiated onto the first adhesive layer 201 on the first chip 302. Therefore, the adhesion of the first adhesive layer 201 to the first chip 302 may be substantially strong. While ultraviolet light may be irradiated onto the first adhesive layer 201 under the second chip 303 exposed by the mask opening, such that the adhesion of the first adhesive layer 201 to the second chip 303 may be reduced or even vanished, facilitating subsequently removing the second chip 303.

Figure 20:
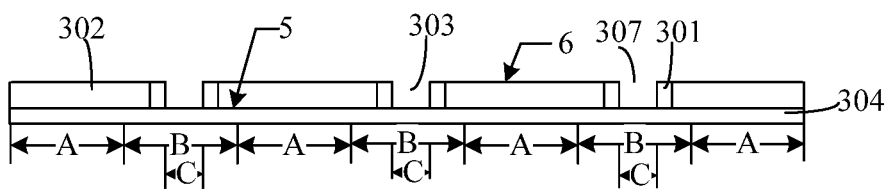

Returning to FIG. 22, after forming the mask layer, the second chip may be removed (S204). FIG. 20 illustrates a schematic diagram of a corresponding semiconductor structure.

Referring to FIG. 20, after irradiating the first adhesive layer with ultraviolent light, the first adhesive layer 201 may be removed to expose the second surface 6 of the first chip 302 and the second chip 303. After removing the first adhesive layer 201, the second chip 303 may be removed to form an opening 307 between adjacent first chips 302.

Removing the second chip 303 may include removing the second chip 303, and mounting the second chip 303 after removing the second chip 303. A tool for taking out the second chip 303 may be a needle, and the needle may include a pin, or a needle tube, etc.

The opening 307 may be used to subsequently accommodate a molding layer. The processes after forming the opening 307 may be the same as or similar to the disclosed embodiments associated with FIGS. 11-16, and are not repeated herein.

In the disclosed method for fabricating the packaging structure, by performing the dividing process on the spacing region of the wafer, the plurality of openings may be formed to penetrate through the spacing region of the wafer, and the plurality of first chips may be formed in the first chip regions on sides of the opening. The size of the opening in the direction parallel to the surface of the second surface of the wafer may be substantially small. Moreover, the size of the opening in the direction parallel to the surface of the second surface of the wafer may be controlled according to process conditions, such that the size of the opening in the direction parallel to the surface of the second surface of the wafer may be further reduced. The opening may be used to accommodate the molding layer, and, thus, the molding layer may occupy a substantially small volume proportion in the formed packaging structure, such that the stress difference between the molding layer and the plurality of first chips in the packaging structure may be reduced. Therefore, the probability of occurrence of warpage in the formed package structure in subsequent processes may be reduced, and the quality of the packaged product may be improved.

Moreover, forming the opening may include performing the film expansion process on the first initial opening. The opening with an appropriate size may be formed by controlling the parameters of the film expansion process, such that the molding layer formed in the opening may occupy a substantially small volume proportion in the formed packaging structure.

In addition, the spacing region may include the second chip region, and the plurality of second chips may be formed in the second chip regions. The opening may be formed in the second chip region by subsequently taking out the second chip. The size of the opening may be determined by the size of the second chip, and the size of the second chip may be controlled by the parameters of the dividing process. Therefore, the opening with an appropriate size may be formed, and the molding layer formed in the opening may occupy a substantially small volume proportion in the formed packaging structure.

Further, the plurality of first chips may be formed by performing the dividing process on the spacing region of the wafer, thus, the wafer may be effectively utilized. Therefore, when packaging, there is no need to select chip(s) from another wafer and to align and mount the selected chip(s). The complexity and difficulty of the packaging process may be effectively reduced.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A packaging structure, comprising:
a plurality of first chips;
a molding layer between each two adjacent first chips of the plurality of first chips, the molding layer and the plurality of first chips having a same thickness, wherein the molding layer covers a sidewall of the each two first chips of the plurality of first chips and exposes a top surface of the each two first chips of the plurality of first chips;
a photoresist layer formed on the molding layer and the first chips, wherein the photoresist layer includes first portions completely covering a top surface of the molding layer and second portions on a top surface of each of the plurality of first chips;
a seed layer formed between each first portion of the photoresist layer and adjacent second portion of the photoresist layer and connected with a corresponding first chip of the plurality of first chips, the seed layer including a plurality of seed layer sections, each seed layer section including two seed layer portions directly formed on a corresponding first chip, and the two seed layer portions being separated from each other by a corresponding second portion of the photoresist layer, wherein the adjacent second portion of the photoresist layer is in direct contact with two closest seed layers, which are also on a portion of a top surface of the first portion of the photoresist layer, and each of the two seed layer portions includes a first seed layer portion directly on the corresponding first chip and a second seed layer portion directly on the photoresist layer; and
metal interconnection structures on the molding layer and on the plurality of the first chips, wherein each metal interconnection structure includes a metal wiring layer on the molding layer and on the plurality of the first chips, a protection layer on the metal wiring layer, an under ball metal structure on the protection layer, and a metal solder ball directly on the protection layer and the under ball metal structure, the protection layer covers a top surface of the second portion of the photoresist layer and a remaining portion of the top surface of the first portion of the photoresist layer exposed by the seed layer, and the metal interconnection structures completely covers a top surface of the second seed layer portion, covers a portion of a top surface of the first seed layer portion, and the protection layer directly on and completely covers a remaining portion of the top surface of the first seed layer portion.

2. The packaging structure according to claim 1, wherein the molding layer is formed by:
forming an opening between the each two adjacent first chips of the plurality of first chips; and
forming the molding layer in the opening.

3. The packaging structure according to claim 1, wherein:
a coefficient of thermal expansion of the molding layer is greater than a coefficient of thermal expansion of the plurality of first chips.

4. The packaging structure according to claim 3, wherein:
the molding layer is made of one of epoxy resin, imide resin, benzocyclobutene resin, polybenzoxazole resin, polybutylene terephthalate, polycarbonate, polyethylene terephthalate, polyethylene, polypropylene, polyolefin, polyurethane, polyolefin, polyethersulfone, polyamide, polyurethane, ethylene-vinyl acetate copolymer, and polyvinyl alcohol; and
the plurality of first chips are made of silicon.

5. The packaging structure according to claim 1, wherein:
the plurality of first chips and the molding layer are located in a plurality of first chip regions.

6. The packaging structure according to claim 1, wherein:
each first chip of the plurality of first chips is connected to two adjacent metal interconnection structures through the seed layer, respectively.

7. The packaging structure according to claim 1, wherein:
each of the two seed layer portions has a concave,
the metal wiring layer includes a plurality of metal wiring layer portions, and
each of the plurality of metal wiring layer portions fills up a corresponding seed layer portion and separated from adjacent metal wiring layer portions by the protection layer.

8. The packaging structure according to claim 1, wherein:
each seed layer section is separated from adjacent seed layer sections by a corresponding first portion of the photoresist layer.

* * * * *